(12) United States Patent
Henson

(10) Patent No.: US 6,839,964 B2
(45) Date of Patent: Jan. 11, 2005

(54) METHOD FOR MANUFACTURING A MULTI-LAYER PRINTED CIRCUIT BOARD

(75) Inventor: Roy Henson, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/214,331

(22) Filed: Aug. 8, 2002

(65) Prior Publication Data

US 2002/0185302 A1 Dec. 12, 2002

Related U.S. Application Data

(62) Division of application No. 09/060,308, filed on Apr. 14, 1998, now Pat. No. 6,720,501.

(51) Int. Cl.[7] .............................................. H01K 3/10
(52) U.S. Cl. ............................ 29/852; 29/846; 29/830; 29/831; 427/97; 427/99
(58) Field of Search ..................... 29/846, 852, 830, 29/831; 427/97, 99

(56) References Cited

U.S. PATENT DOCUMENTS

| | | | |
|---|---|---|---|
| 4,513,355 A | | 4/1985 | Schroeder et al. |
| 4,668,332 A | * | 5/1987 | Ohnuki et al. ................. 216/19 |
| 4,799,128 A | | 1/1989 | Chen |
| 4,837,622 A | | 6/1989 | Whann et al. |
| 4,864,722 A | * | 9/1989 | Lazzarini et al. ............. 29/830 |
| 4,868,350 A | * | 9/1989 | Hoffarth et al. ............. 174/266 |
| 4,916,260 A | * | 4/1990 | Broaddus et al. ........... 174/268 |
| 5,045,975 A | | 9/1991 | Cray et al. |
| 5,148,103 A | | 9/1992 | Pasiecznik, Jr. |
| 5,185,502 A | | 2/1993 | Shepherd et al. |
| 5,191,174 A | | 3/1993 | Chang et al. |
| 5,218,761 A | | 6/1993 | Maniwa et al. |
| 5,225,777 A | | 7/1993 | Bross et al. |
| 5,309,324 A | | 5/1994 | Herandez et al. |
| 5,322,593 A | * | 6/1994 | Hasegawa et al. ............. 216/20 |
| 5,363,280 A | | 11/1994 | Chobot et al. |
| 5,371,654 A | | 12/1994 | Beaman et al. |
| 5,464,950 A | | 11/1995 | Horiuchi et al. |
| 5,476,211 A | | 12/1995 | Khandros |
| 5,488,542 A | | 1/1996 | Ito |
| 5,491,426 A | | 2/1996 | Small |
| 5,509,200 A | | 4/1996 | Frankeny et al. |
| 5,521,518 A | | 5/1996 | Higgins |
| 5,534,784 A | | 7/1996 | Lum et al. |
| 5,543,586 A | | 8/1996 | Crane, Jr. et al. |
| 5,554,940 A | | 9/1996 | Hubacher |
| 5,557,502 A | | 9/1996 | Banerjee et al. |
| 5,623,160 A | * | 4/1997 | Liberkowski ............... 257/621 |
| 5,701,085 A | | 12/1997 | Malladi et al. |
| 5,786,701 A | | 7/1998 | Pedder |
| 5,806,181 A | | 9/1998 | Khandros et al. |
| 5,822,856 A | | 10/1998 | Bhatt et al. |
| 5,912,809 A | | 6/1999 | Steigerwald et al. |
| 5,917,707 A | | 6/1999 | Khandros et al. |
| 6,050,829 A | | 4/2000 | Eldridge et al. |
| 6,121,554 A | | 9/2000 | Kamikawa |
| 6,378,201 B1 | * | 4/2002 | Tsukada et al. ............... 29/852 |
| 6,653,574 B2 | * | 11/2003 | Tsai et al. ................... 174/260 |

FOREIGN PATENT DOCUMENTS

| | | |
|---|---|---|
| EP | 632281 | 1/1995 |
| JP | 63243768 | 10/1988 |
| JP | 5-335713 | * 12/1993 |
| JP | 6249924 | 9/1994 |

\* cited by examiner

*Primary Examiner*—Richard Chang
(74) *Attorney, Agent, or Firm*—Fliesler Meyer LLP

(57) ABSTRACT

A method of manufacturing a multilayer printed circuit board (PCB) is provided, the PCB having blind vias connecting to power layers. A portion of the blind vias in the power layers are grouped together to form a cluster of blind vias. Signal layers, provided separate from the power layers, include signal routing channels, with at least some of the signal routing channels aligned above or below the cluster of blind vias of the power layers.

12 Claims, 10 Drawing Sheets

METHOD FOR MANUFACTURING A MULTI-LAYER PRINTED CIRCUIT BOARD

CROSS-REFERENCE TO RELATED APPLICATIONS

This application is a divisional of Ser. No. 09/060,308, filed Apr. 14, 1998, now U.S. Pat. No. 6,720,501 (incorporated in its entirety herein by reference).

BACKGROUND OF THE INVENTION

1. Field of the Invention

The present invention relates generally to a printed circuit board for use in a probe card for testing a semiconductor wafer, and more particularly, to a multilayer printed circuit board having clustered vias in power layers to facilitate the routing of signal traces in signal layers.

2. Description of Related Art

Probe cards are on, or typically include, printed circuit boards ("PCBs") and are utilized to distribute signals, power, and ground between a remote host tester and a semiconductor device under test ("DUT") resident on a wafer under test ("WUT"). Typically, thousands of signals are communicated between the remote host tester and the DUTs resident on a WUT. As a result, a signal routing scheme must be incorporated into the design of a probe card's PCB.

Referring to FIG. 1, a newly developed probe card 10 of the assignee of the present invention has a diameter "D" of 12 to 18 inches. Signals input along the outer region 12 of the probe card 10 are routed to an interior active region 14 having a 2.5 inch square area. Referring now to FIG. 2, the interior active region 14 includes an array 16 of conductive contact elements 18. A contact element 18 is ultimately connected through a probe tip (not shown) for contact with a pad of a device under test.

Although the array 16 of this new probe card includes thousands of contact elements 18, a seven by seven array is illustrated for clarity. Each horizontal row of contact elements 18 is separated from a neighboring row of contact elements by a horizontal channel 20. Each vertical column of contact elements 18 is separated by a neighboring column of contact elements 18 by a vertical channel 22. Each contact element 18 is connected to a trace 24 that may carry a signal, ground, or power from the outer region 12 of the probe card 10 to the contact element 18. The traces 24 are laid down using conventional PCB techniques such as, but not limited to, photo lithographic masking, etching and/or sputtering. As discussed in further detail below, in one embodiment, only one trace 24 can pass between any pair of neighboring contact elements 18 given the close dimension design of this new probe card. Accordingly, a drawback encountered in routing is the difficulty in laying down traces 24 that connect all the contact elements 18 in an array to their corresponding signal, power, or ground sources located at the outer region 12 of the probe card 10. For example, when contact element 18c is connected to a ground source via ground trace 24c and contact element 18d is connected to a power source via power trace 24d, contact elements 18a and 18b cannot be connected to signal sources because the adjacent horizontal and vertical channels 20 and 22 are occupied by the ground and power traces 24c and 24d due to the close spacing required between the contact elements 18 in this new probe card.

A multilayer PCB overcomes, to some extent, the above-described drawback. Turning now to FIGS. 3 and 4, a portion of a multilayer PCB 26 of the new probe card includes one or more power layers 28, signal layers 30, and ground layers 32. Although the multilayer PCB can include dozens of layers, a seven layer PCB portion is illustrated for clarity. Each ground layer 32 controls the impedance of one or more adjacent signal layers 30 and can also provide signal isolation between neighboring signal layers 30. The ground layer 32 may also provide ground to selected conductive vias 34. The vias 34 are shown in FIG. 3 before they are filled with metal. A ground layer 32 may be a polymeric dielectric or ceramic dielectric layer, which is metal clad 62 on a side not in contact with the signal traces on adjacent layers. Generally, a ground layer 32 is situated between the opposing planar surfaces of two neighboring signal layers 30. While the figures depict a ground layer 32 between each pair of signal layers 30, this is generally not necessary and a ground layer 32 need only be interspersed between some of the signal layers 30, depending on the circuit design considerations of signal isolation.

The signal layers 30 contain signal traces 24 which route signals from the outer region 12 of the multilayer PCB 26 to selected conductive vias 34. The power layers 28 may contain power traces 25 which route voltages (e.g., Vdd and Vss, which can be on different power layers in the new probe card design) from the outer region of the multilayer PCB 26 to selected conductive vias 34. Alternatively, large energized planar regions of the power layers 28 can be energized by different voltage sources (e.g., either all Vdd or all Vss, or combinations of both) and selected conductive vias 34 can be electrically connected to the energized regions while the remaining conductive vias 34 are kept electrically isolated from the energized regions of the power layers 28. It should be noted that where "power" is referred to herein, any and all power connections are included. Recent trends in technology have tended to push the decision of semiconductor devices in the direction of single voltage supplies, and this terminology reflects this trend. However, herein, the term power refers to all required power supply voltages.

Electrical connections 36 electrically connect contact points on the signal traces 24, power traces 25, or energized planar regions 54 (see FIG. 8) of the power layers 28 to the conductive vias 34 which, in turn, are electrically connected to the contact elements 18 mounted on the lower surface of the multilayer PCB 26. In some of the figures these connections between the vias and the traces 24, 25, or regions 54 are diagrammatically shown as slash ("\,") marks. It is to be understood, however, that the actual electrical connections 36 may be formed using conventional techniques such as photo lithographic masking, etching and/or sputtering to cause the traces 24, 25 and regions 54 to be formed up to the edges of the selected metal filled vias 34 to electrically connect to them. See, for example, FIGS. 8 and 9.

By this arrangement, the routing drawback encountered by single layer PCBs is overcome since multiple signal, power, and ground layers are provided for routing signal, power, and ground traces such that all the contact elements 18 in the active region 14 of a PCB 12 are connected to their corresponding signal, power, or ground sources located at the outer region of the PCB 12. For example, as shown in FIG. 4, contact elements 18c and 18d can be electrically connected to power traces or power regions located on the power layers 28 without impeding contact elements 18a and 18b from being electrically connected to signal traces provided on the signal layers 30.

While multilayer PCBs facilitate the routing of signals, power, and ground between a remote host tester and a DUT, these PCBs have a number of drawbacks.

Referring now to FIGS. 5(A) and 5(B), a multilayer PCB manufacturing method can include masking circuit or trace patterns onto the individual power layers 28, signal layers 30, and ground layers 32. Afterwards, an adhesive is applied to the layers 28, 30, and 32, and the layers 28, 30, and 32 are aligned and combined to form a vertical stack 38. Vias 34 are then drilled through the vertical stack 38. Next, the vias 34, 34a and 34b are seeded or plated to create vertical conductive pathways between selected traces or regions (see FIG. 3) and the contact elements (see FIG. 4) which are later mounted over the via openings at the lower surface of the vertical stack 38.

Turning now to FIG. 6, a representative signal layer 30 generated by the above-described manufacturing method is shown. Vias 34a represent vias that interconnect the power layers 28 (located below the signal layers 30) to the contact elements 18 on the lower surface of the multilayer PCB. Vias 34b represent vias that interconnect the signal layers 30 or ground layers 32 to the contact elements 18 on the lower surface of the multilayer PCB 26. In the multilayer PCBs of the assignee's new probe card, vias 34a and 34b have 24 mil diameters and are spaced apart on 50 mil centers. An additional 5 mil space extending around the outer region of the vias 34a and 34b is kept free of trace circuitry 24. This 5 mil space allows for machining and human errors in positioning the vias 34a and 34b such that a signal trace 24 will not be clipped during a via forming process, such as drilling, if vias 34a and/or 34b are slightly misaligned. Therefore, a via's "footprint" in this design is approximately 34 mil. The signal traces 24 in this design, preferably, have 7 mil widths and 14 mil spacing.

There are a number of disadvantages in manufacturing a PCB of this design using the conventional method steps just described. First, only one signal trace 24 can pass between any pair of neighboring vias 34a and 34b since the channel between a pair of neighboring vias 34a and 34b is 16 mil. Therefore, the presence of the vias 34a reduces the number of signal traces 24 that can be laid down on a given signal layer since only one signal trace 24 can pass between a pair of neighboring vias 34a and 34b. Accordingly, a multilayer PCB manufacturing step of drilling vias through all the layers of the PCB, regardless of what conductive pathway is established by a given via, would result in inefficient routing of signal traces on the signal layers of the PCB since signal layer real estate is squandered on vias (e.g., vias 34a) that only establish electrical pathways below the signal layers.

Second, additional signal layers must be incorporated into a conventional multilayer PCB to permit routing of signal traces since the presence of vias in all the signal layers limits the number of signal traces that can be laid down on each signal layer. As can readily be appreciated, the incorporation of additional signal layers increases the size of the PCB which, in turn, increases the size and cost of a probe card utilizing the PCB.

Third, vias can only be drilled through a limited number of ground, signal, and power layers. The limiting parameters are the via diameter and the drill capability, i.e. for a given length of hole, there is a practical lower limit for the diameter of the drill. As a result, only a finite number of signal layers can be incorporated into a probe card's PCB. Therefore, there is a limit to the number of additional signal layers that can be used to route signal traces around voltage vias. As can readily be appreciated, an upper limit of signal layers is quickly reached as the complexity of the PCB routing scheme increases.

BRIEF SUMMARY OF THE INVENTION

The above discussed problems of manufacturing a probe card PCB having close dimensions are overcome by the present invention of a multilayer printed circuit board which includes clustered blind vias, i.e. vias which are open only at one end, in power layers to facilitate the routing of signal traces in signal layers. A portion of the blind vias in the power layers are grouped together to form a cluster of blind vias. Since the blind vias go only partially through the PCD, signal layers beyond the blind vias have some extra space to route traces. By clustering the blind vias along bands, corresponding signal routing channels can be provided in the signal layers and aligned with the clusters of blind vias in the power layers to permit routing of signal traces or signal circuitry therethrough. A method of manufacturing the multilayered printed circuit board includes assembling a first subassembly of power layers, forming a group of clustered power vias through the first subassembly, assembling a second subassembly of signal layers, combining the first subassembly with the second subassembly such that the clustered vias in the first subassembly align with signal routing channels in the second subassembly, forming signal vias that extend through the first and second subassemblies, and seeding or plating the power and signal vias.

A feature of the present invention includes a multilayer printed circuit board including a signal layer having signal routing circuitry on a first surface thereof, the signal routing circuitry having a plurality of contact points, one or more power layers mounted to a second surface of the signal layer, each power layer having power routing circuitry on a first surface thereof, the power routing circuitry having a plurality of contact points, a plurality of conductive through-vias extending through the signal and power layers, selected ones of the conductive through-vias being selectively connected to the plurality of signal routing circuitry contact points, and a plurality of conductive blind vias extending through the power layers, the conductive blind vias being selectively connected to the plurality of power routing circuitry contact points, the conductive blind vias being positioned in the power layers such that at least a portion of the signal routing circuitry on the signal layer is routed over the conductive blind vias in the power layers.

Another feature of the present invention includes a multilayer printed circuit board including a power layer having power routing circuitry on a first surface thereof, the power routing circuitry having a plurality of contact points, a signal layer having signal routing circuitry on a first surface thereof, the signal routing circuitry having a plurality of contact points, a plurality of conductive through-vias extending through the signal and power layers, and being selectively connected to the plurality of signal routing circuitry contact points a plurality of conductive blind vias extending through the power layer, the conductive blind vias being selectively connected to the plurality of power routing circuitry contact points and positioned in the power layer such that at least one cluster of conductive blind vias, runs between at least one adjacent pair of the plurality of conductive through vias, and at least one signal routing channel positioned on the first surface of the signal layer such that the signal routing channel is aligned with the at least one cluster of conductive blind vias, the signal routing channel having at least a portion of the signal routing circuitry routed therethrough.

A further feature of the present invention includes a method of manufacturing a multilayer printed circuit board including the steps of providing power routing circuitry on a first surface of a power layer forming a plurality of electrically conductive vias in the power layer that extend from the first surface of the power layer to a second surface of the power layer the plurality of power layer vias selectively electrically contacting the power routing circuitry, a first portion of the plurality of power layer vias being aligned to establish at least one cluster of power layer vias, providing signal routing circuitry and at least one signal routing channel on a first surface of a signal layer such that a portion of the signal routing circuitry is routed through the at least one signal routing channel, combining the signal layer and the power layer such that the at least one signal routing channel aligns with the at least one cluster of power layer vias, and forming a plurality of electrically conductive vertical through-vias in the combined signal and power layers such that the through-vias extend from the first surface of the signal layer to a second surface of the power layer, the through-vias selectively electrically contacting the signal routing circuitry.

A still further feature of the present invention includes a method of manufacturing a multilayer printed circuit board including the steps of providing power routing circuitry on first surfaces of a plurality of power layers, aligning the power layers, combining the aligned power layers into a first subassembly having a top power layer and a bottom power layer forming a plurality of electrically conductive vias in the first subassembly that extend from a first surface of the top power layer to a second surface of the bottom power layer, the plurality of power layer vias selectively electrically contacting the power routing circuitry in the first subassembly, at least a portion of the plurality of power layer vias being aligned to establish at least one cluster of power layer vias, providing signal routing circuitry and at least one signal routing channel on first surfaces of a plurality of signal layers such that at least a portion of the signal routing circuitry is routed through the at least one signal routing channel on the signal layers, aligning the signal layers, combining the aligned signal layers into a second subassembly having a top signal layer and a bottom signal layer, aligning the first subassembly and the second subassembly such that the at least one signal routing channel in the signal layers aligns with the at least one cluster of power layer vias, combining the aligned first and second subassemblies into a final assembly having a top signal layer and a bottom power layer, and forming a plurality of electrically conductive vertical through-vias in the final assembly such that the through vias extend from a first surface of the top signal layer to a second surface of the bottom power layer, the through-vias selectively electrically contacting the signal routing circuitry in the first subassembly of signal layers.

It is therefore an object of the present invention to provide a probe card PCB and a new PCB card manufacturing method which overcomes the drawbacks of the prior art described above.

It is another object of the present invention to provide a probe card PCB having clustered blind vias in power layers to facilitate routing signal traces in signal layers.

It is a further object of the present invention to provide a probe card PCB having signal routing channels in signal layers that align with clusters of blind vias in power layers to facilitate the routing of signal traces.

BRIEF DESCRIPTION OF THE FIGURES

The aforementioned advantages of the present invention as well as additional advantages thereof will be more clearly understood hereinafter as a result of a detailed description of the preferred embodiments of the invention when taken in conjunction with the following drawings in which.

DETAILED DESCRIPTION OF THE INVENTION

Figure 7A:
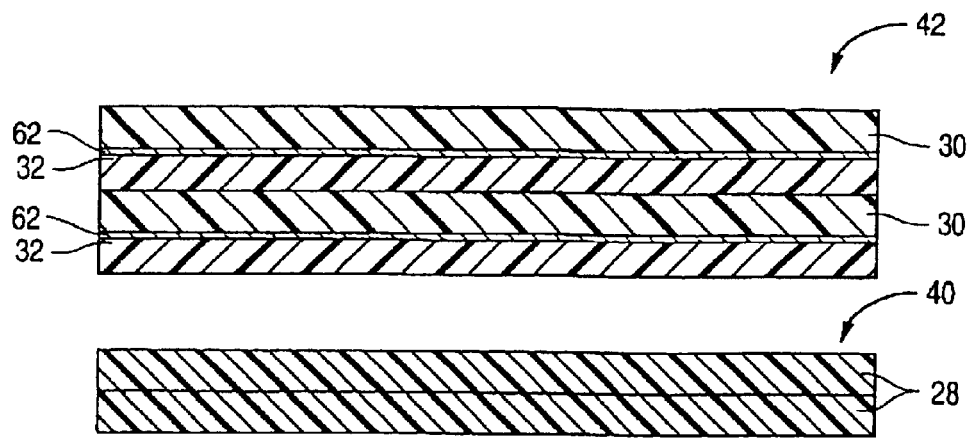
FIGS. 7(A)-7(E) are vertical cross-sectional, diagrammatic views for illustrating the steps of an improved method of manufacturing a multilayer PCB of the present invention.

It is to be understood in the following discussion that a description of only an idealized PCB is given for purposes of illustrating the concepts of the invention. An actual multilayer PCB could have far more layers and many more vias than are shown in the following example. Referring to FIGS. 7(A)-7(E), a preferred multilayer PCB manufacturing method of a first embodiment of the present invention is shown. Turning now to FIGS. 7(A) and 8, metalized patterns or regions 54, 60, and 62 are masked onto individual power layers 28, signal layers 30, and ground layers 32, respectively. Although the ground layers 32 are shown as being interspersed between each of the signal layers 30, this need not be the case. Ground layers 32 may be positioned between groups of signal layers, depending upon the circuit design and the need for signal isolation. It also is to be understood that while the regions, traces and contacts are depicted as only being on one side of the PCBs, the regions, traces and contacts could be on either side or both sides, provided that no boards can be placed so that opposing conductive surfaces are in contact with each other unless an insulating layer exists between them. Afterwards, an adhesive is applied to the power layers 28 and they are aligned and combined to form a first vertical stack or subassembly 40. Similarly, an adhesive is also applied to the signal layers 30 and ground layers 32, and they are aligned and combined to form a second vertical stack or subassembly 42.

Figure 7B:
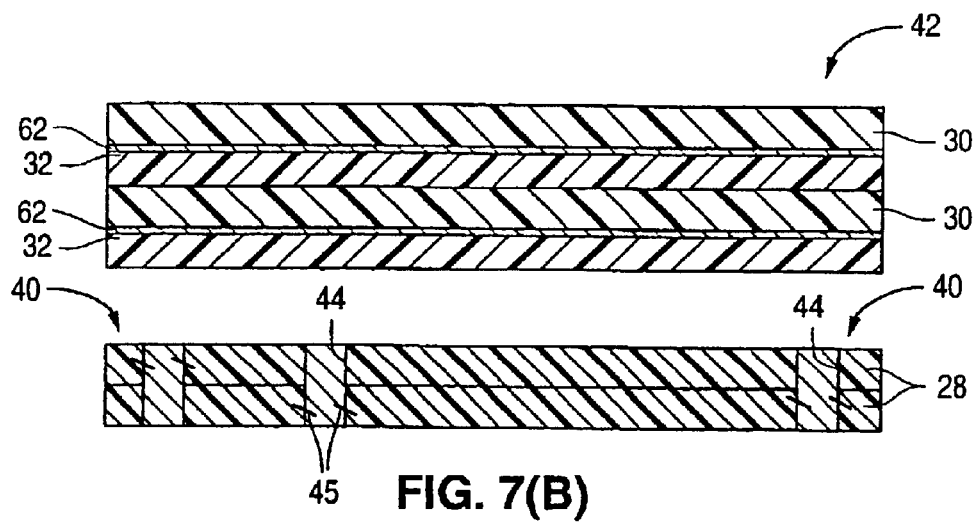

Referring now to FIG. 7(B), vias 44 (which will later herein be referred to as "blind vias" 44) are drilled through the first vertical stack 40 such that the vias 44 contact voltage traces or regions 54 at predetermined contact points 45, shown diagrammatically in FIGS. 7(B)-7(E) by a slash mark. In actual practice, the traces or conductive regions which are to be in contact with the vias 44 are extended up to and surround the exit point of the vias 44 in the surface upon which the region or trace exists. The blind vias 44 are seeded or plated to establish conductive pathways between the traces or conductive regions at the predetermined contact points 45 and electrical contacts 52 that are mounted on the bottom surface over the openings of the blind vias 44. When the vias 44 are filled with conductive material, an electrical contact is made from the via 44 to the trace or conductive region.

Figure 7C:
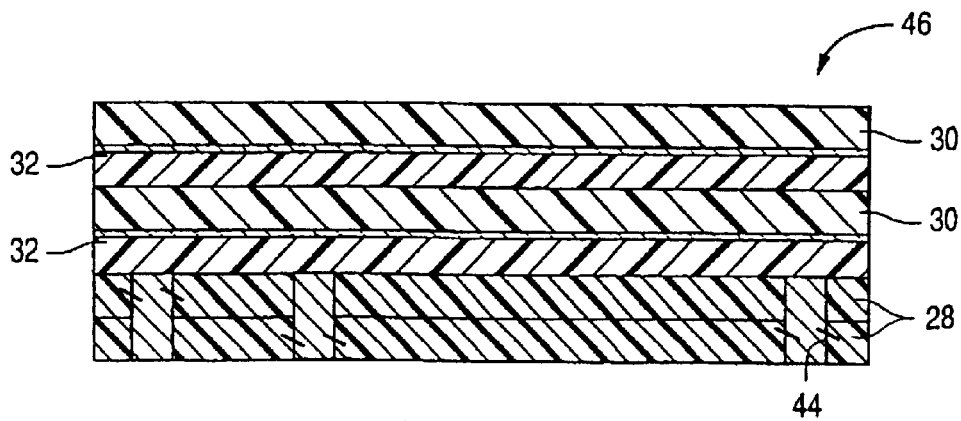
Figure 7D:
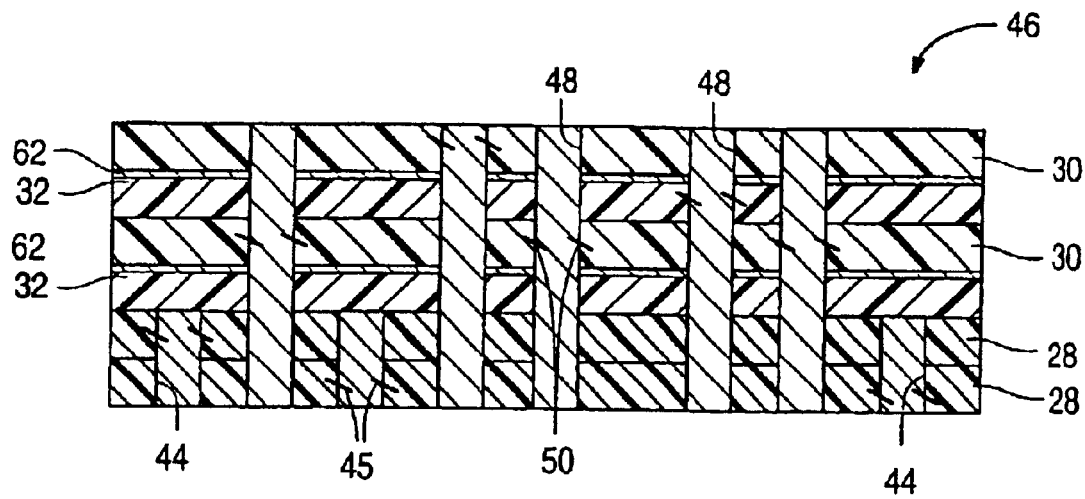
Figure 8:
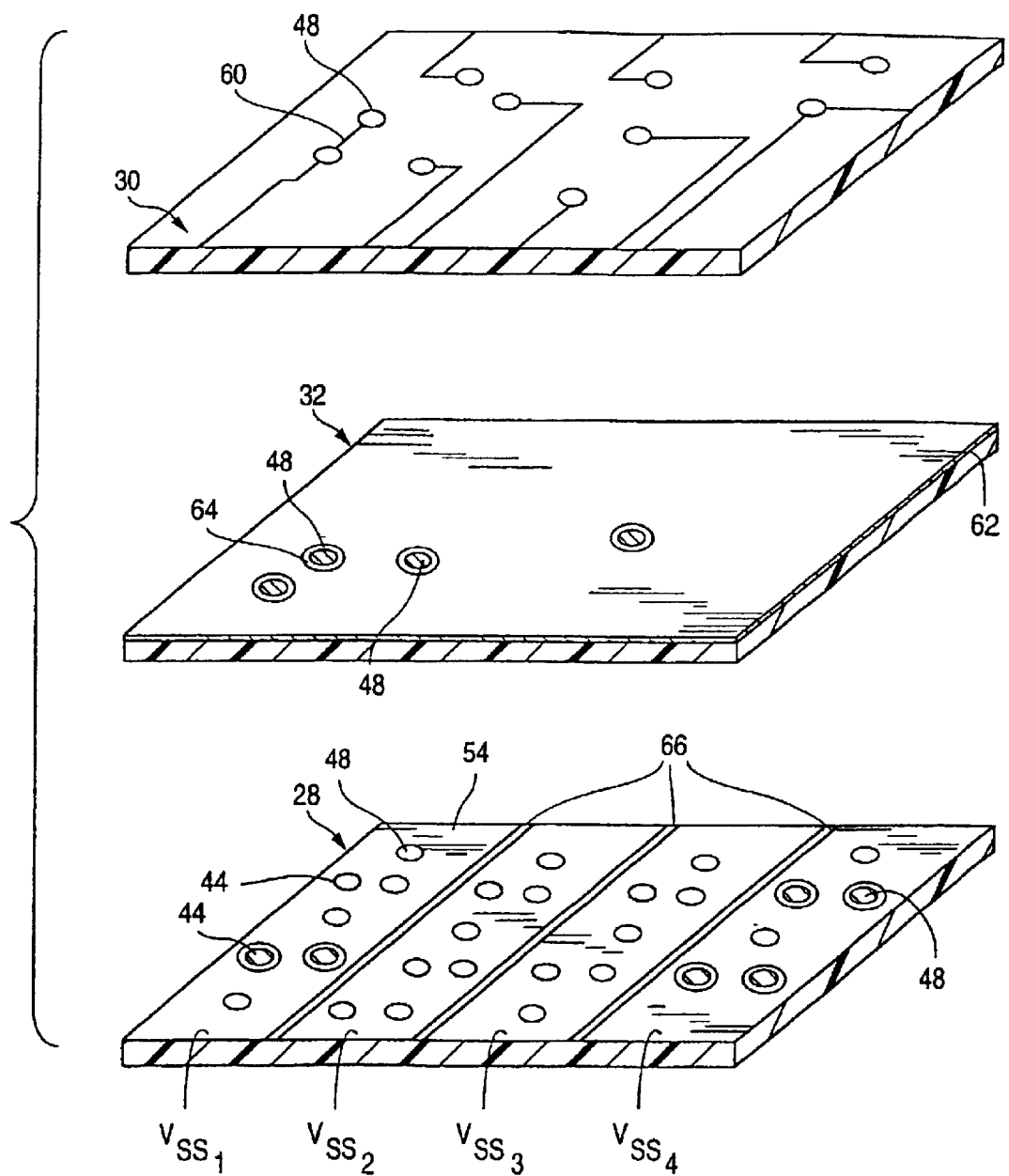
FIG. 8 is a diagrammatic exploded, perspective view of the signal, ground and power layers of a multilayer PCB of the first embodiment of the present invention.

Referring now to FIG. 7(C), an adhesive is applied to the first and second vertical stacks 40 and 42 and the vertical stacks 40 and 42 are aligned and combined to form a final vertical stack or assembly 46. Referring now to FIG. 7(D), vias 48 (referred to hereinafter as "through-vias" as distinct from the "blind vias") are drilled through the final vertical stack 46 such that the through-vias 48 will electrically contact signal traces 60 or ground regions 62 at predetermined contact points 50 indicated diagrammatically by slash marks. It should be noted that the final vertical stack 46 of power layers 28, signal layers 30, and ground layers 32 contains two type of vias: the blind vias 44 that extend through the power layers 28 and terminate below the signal and ground layers 30 and 32, and the through-vias 48 that extend through the power layers 28, signal layers 30, and ground layers 32.

Figure 7E:
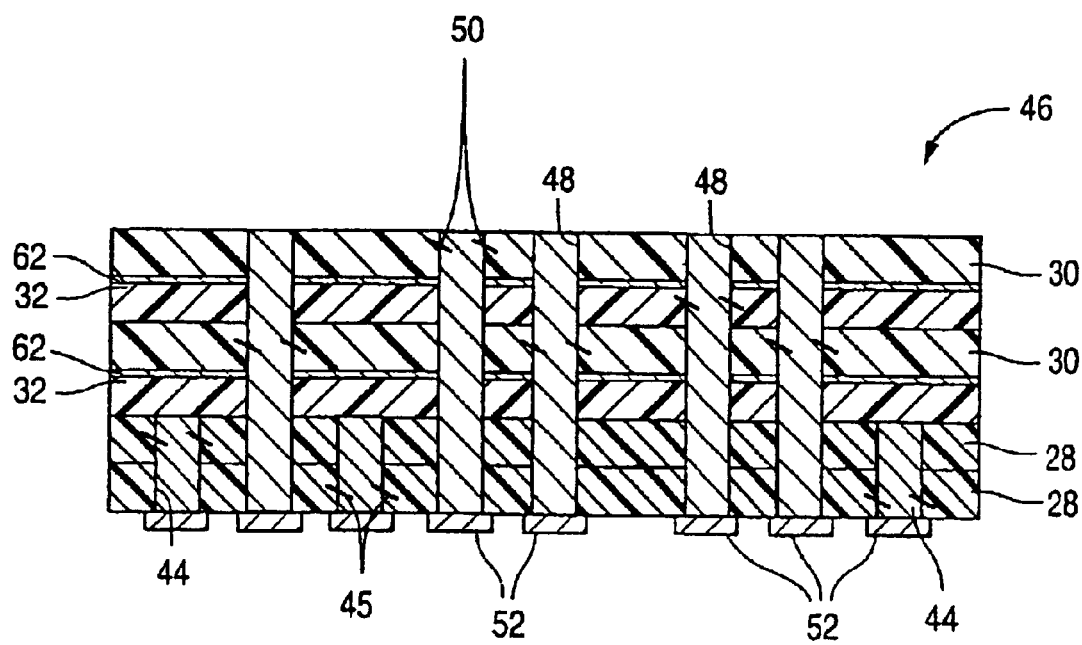

Referring now to FIG. 7(E), the through-vias 48 are seeded or plated to establish conductive pathways between the predetermined contact points 50 and electrical contacts 52 that are mounted on the bottom surface of the final vertical stack 46 over the openings of the through-vias 44.

Referring now to FIG. 8, a representative power layer 28, ground layer 32 and signal layer 30 of the multilayer PCB of a first embodiment of the present invention is shown. Blind vias 44 represent vias that establish electrical pathways between the plurality of energized regions 54 on the power layer 28 and the electrical contacts 52 (see FIG. 7(E)) positioned on the lower surface of the multilayer PCB. The regions 54 are separated from each other by non-metal regions 66 and connected to separate Vss voltage supplies in this particular embodiment but could also be connected to the same supply or some could be connected to a Vdd supply in other embodiments.

As discussed above, vias 44 are blind vias that do not extend into the signal or ground layers 30 and 32 located above the power layers 28. Through-vias 48 extend through and selectively establish electrical pathways between the power layers 28, the signal layers 30 or ground layers 32 and their associated electrical contacts 52 (see FIG. 7(E)) positioned on the lower surface of the multilayer PCB. Although some of the through-vias 48 extend through the power layers 28, unless these through-vias are conveying power from the power layers 28 to the signal layers 30, these through-vias 48 are kept electrically isolated from the energized regions 54 and traces 60 by the expedient of having the regions 54 and traces 60 sufficiently spaced back (as shown at 64) from the edges of the via holes that no electrical connection is made when the vias 48 are filled with metal.

Figure 1:
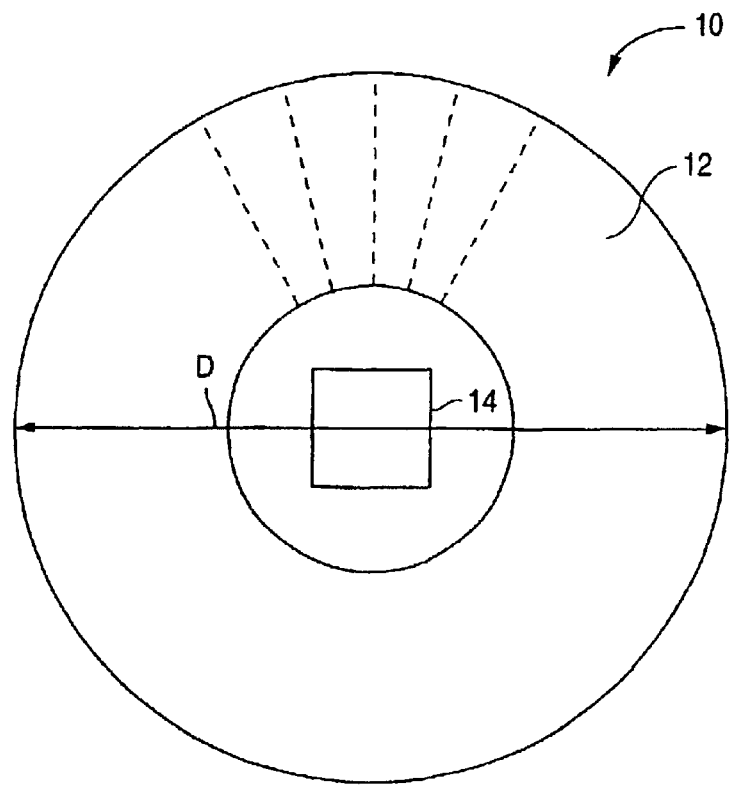
FIG. 1 is a diagrammatic top plan view of a new type of probe card PCB.
Figure 4:
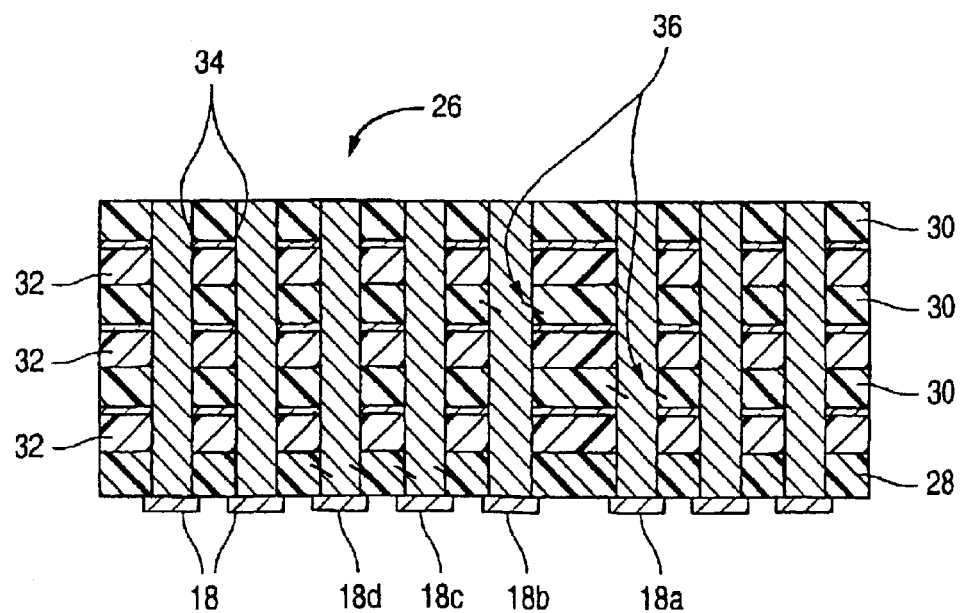
FIG. 4 is a vertical cross-sectional, diagrammatic view of the multilayer PCB shown in FIG. 3.
Figure 2:
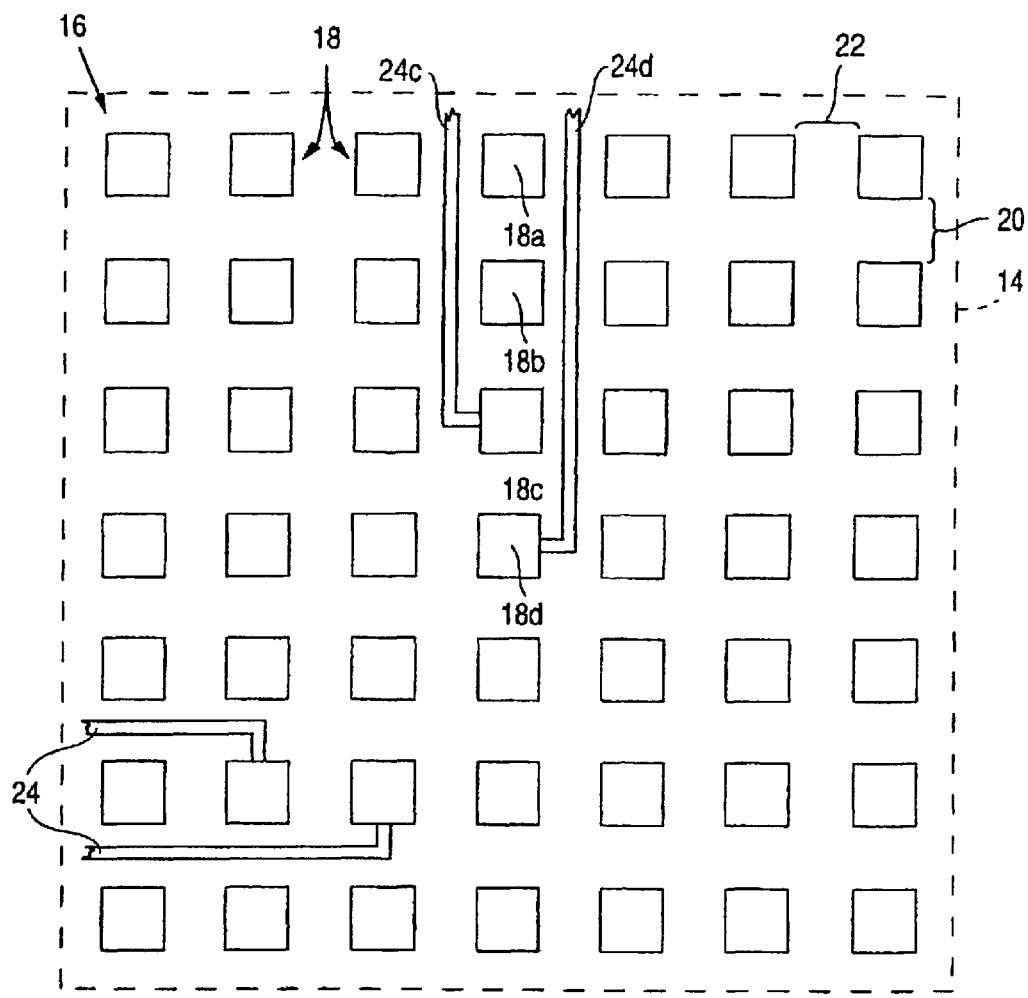
FIG. 2 is a magnified view of the active region shown in FIG. 1.
Figure 3:
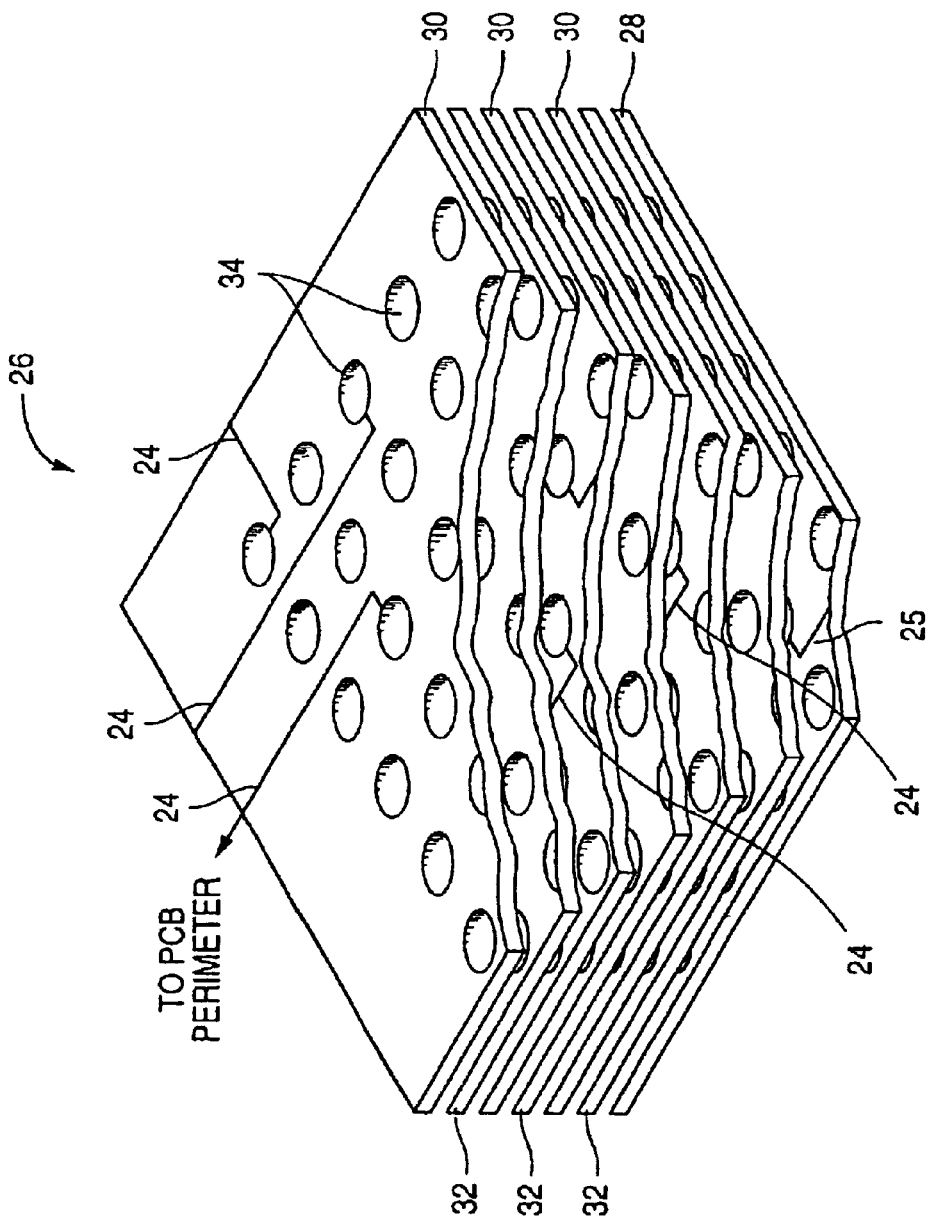
FIG. 3 is an exploded perspective view, partially in section, of a multilayer PCB.
Figure 5A:
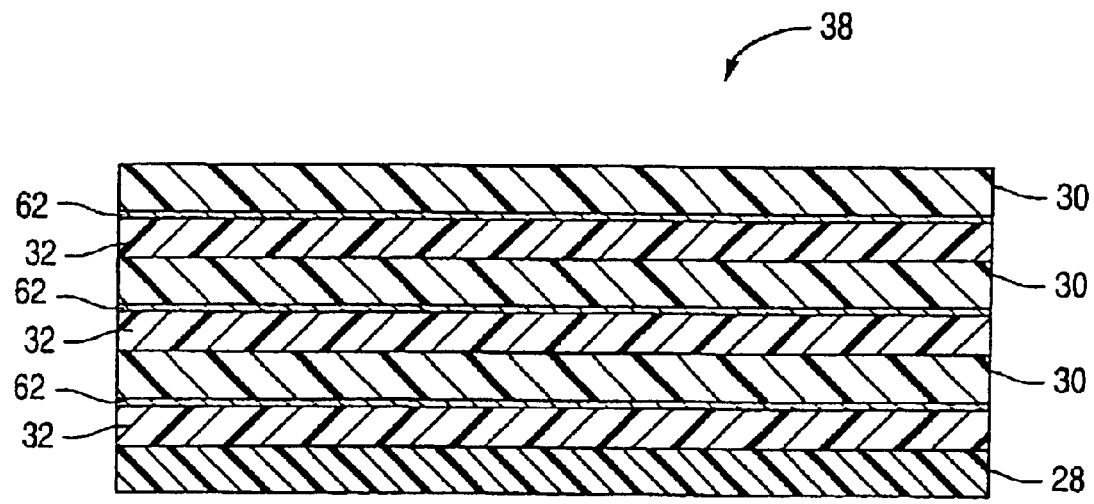
FIGS. 5(A) and 5(B) are vertical cross-sectional, diagrammatic views for illustrating the steps of a multilayer PCB manufacturing method.
Figure 5B:
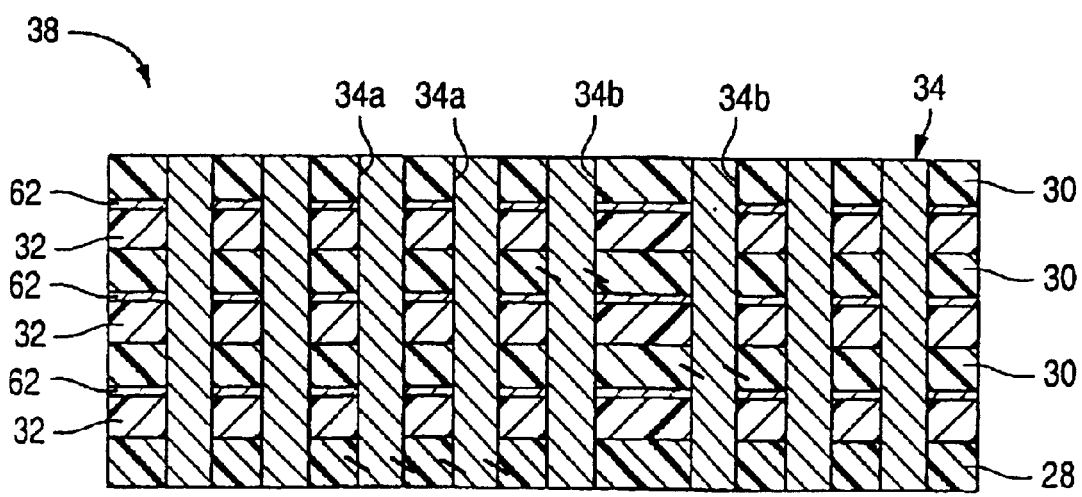
Figure 6:
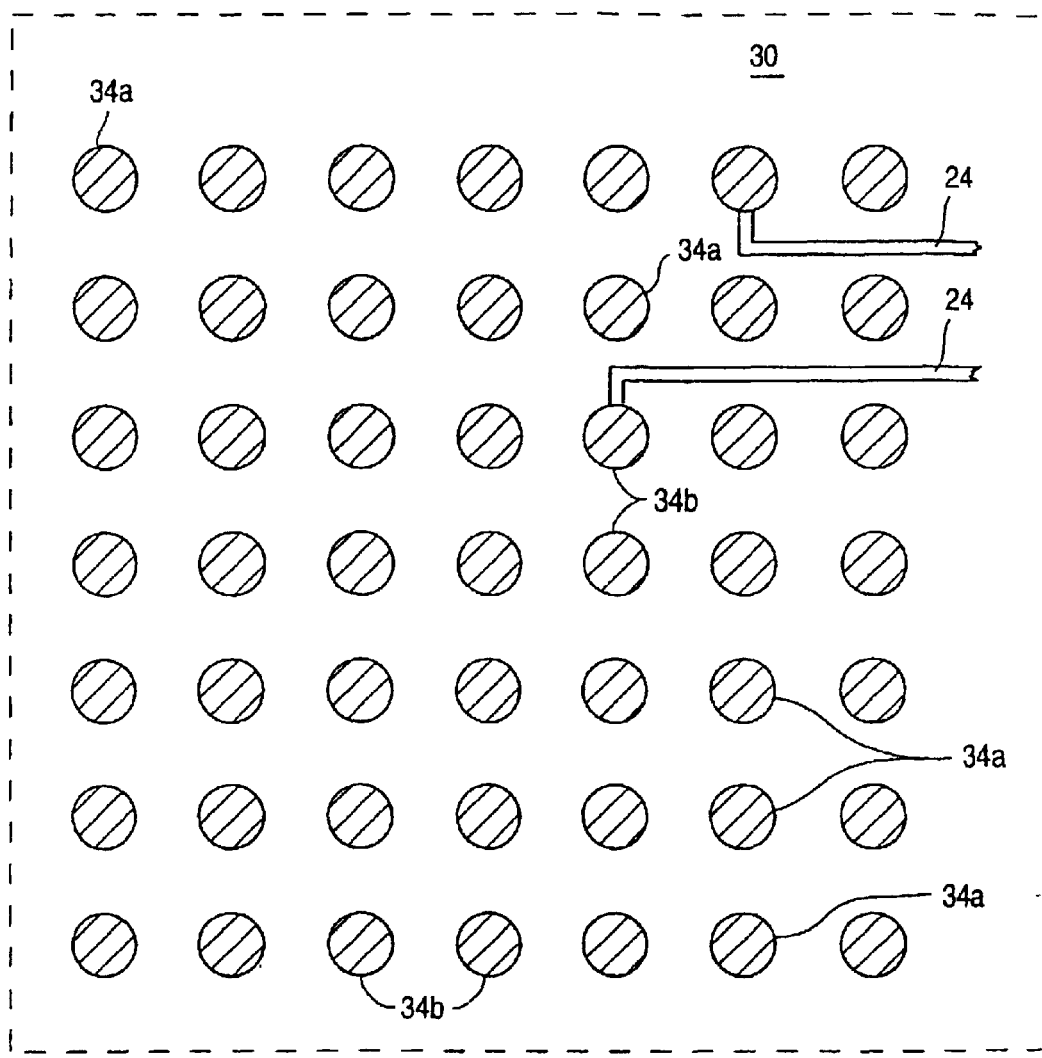
FIG. 6 is a diagrammatic top plan view of a multilayer PCB signal layer.
Figure 9:
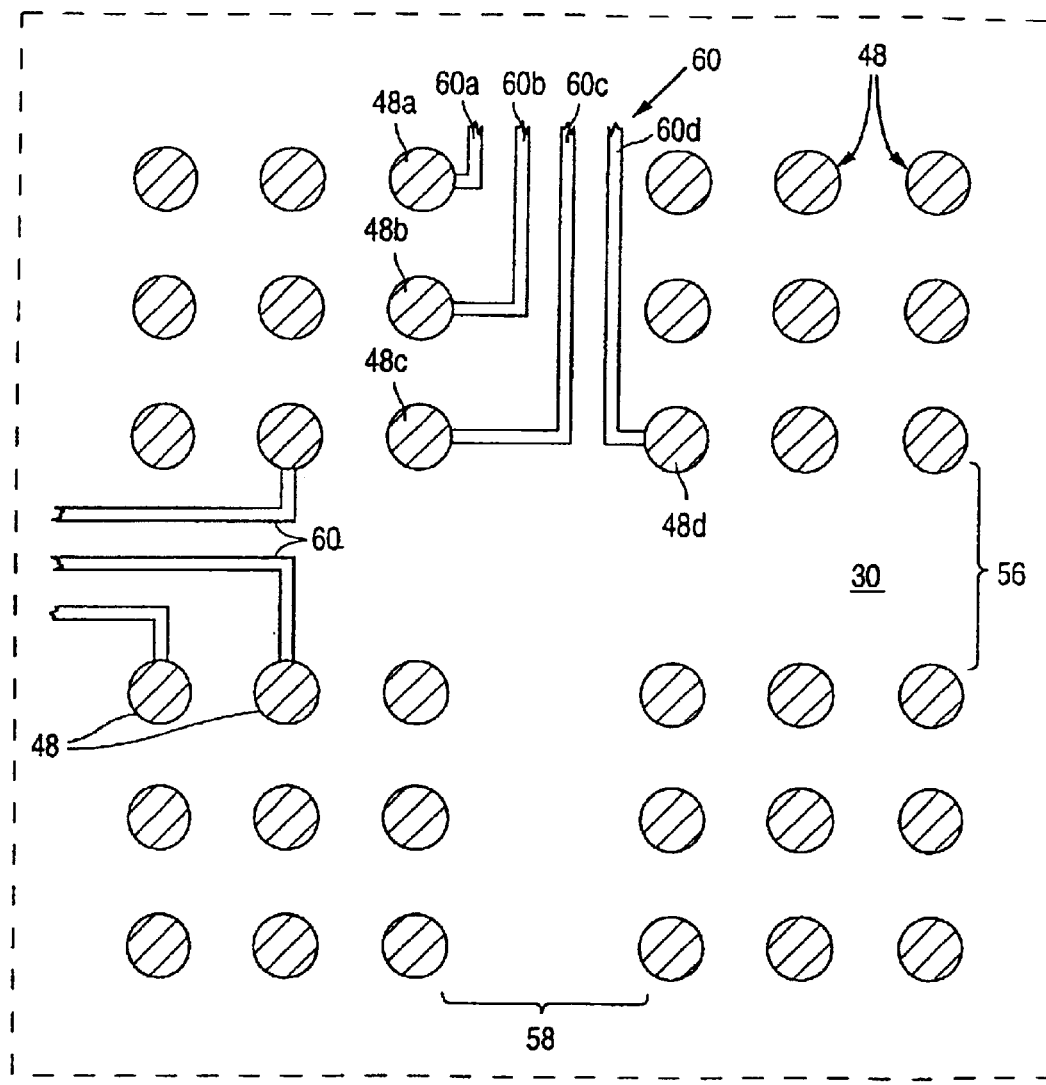
FIG. 9 is a diagrammatic top plan view of a signal layer of the multilayer PCB of the present invention.

Referring now to FIG. 9, a representative signal layer 30 of the multilayer PCB of the present invention is shown. Only through-vias 48 extend through the signal layer 30. The blind vias 44 present in the power layers 28 (see FIG. 8) are not present in the signal layer 30. This absence creates enlarged signal routing channels 56, 58 between the through-vias 48 that neighbor the blind vias 44 in the power layers 28. In particular, if the enlarged signal routing channels 56, 58 have widths of 100 mil, up to four signal traces 60 (having 7 mil widths and 14 mil spacings) may be routed therethrough. The presence of the enlarged channels 56, 58 accommodates a routing scheme for signal traces 60 that could not be accommodated by the signal layers shown in FIGS. 2 and 6. For example, as shown in FIG. 9, through-vias 48c and 48d can be connected to signal traces 60c and 60d, respectively, without impeding through-vias 48a and 48b from being connected to signal traces 60a and 60b, respectively. Significantly, the enlarged channels 56, 58 permit such routing without incorporating additional signal layers for routing signal traces 60a and 60b.

As a result, the signal routing scheme of the present invention facilitates the routing of signals in a multilayer PCB without increasing the PCB size by incorporating additional signal layers within the multilayer PCB. Furthermore, the multilayer PCB of the present invention simplifies signal routing in a multilayer PCB environment by increasing the number of signal traces that can be routed on a given signal layer.

Figure 10:
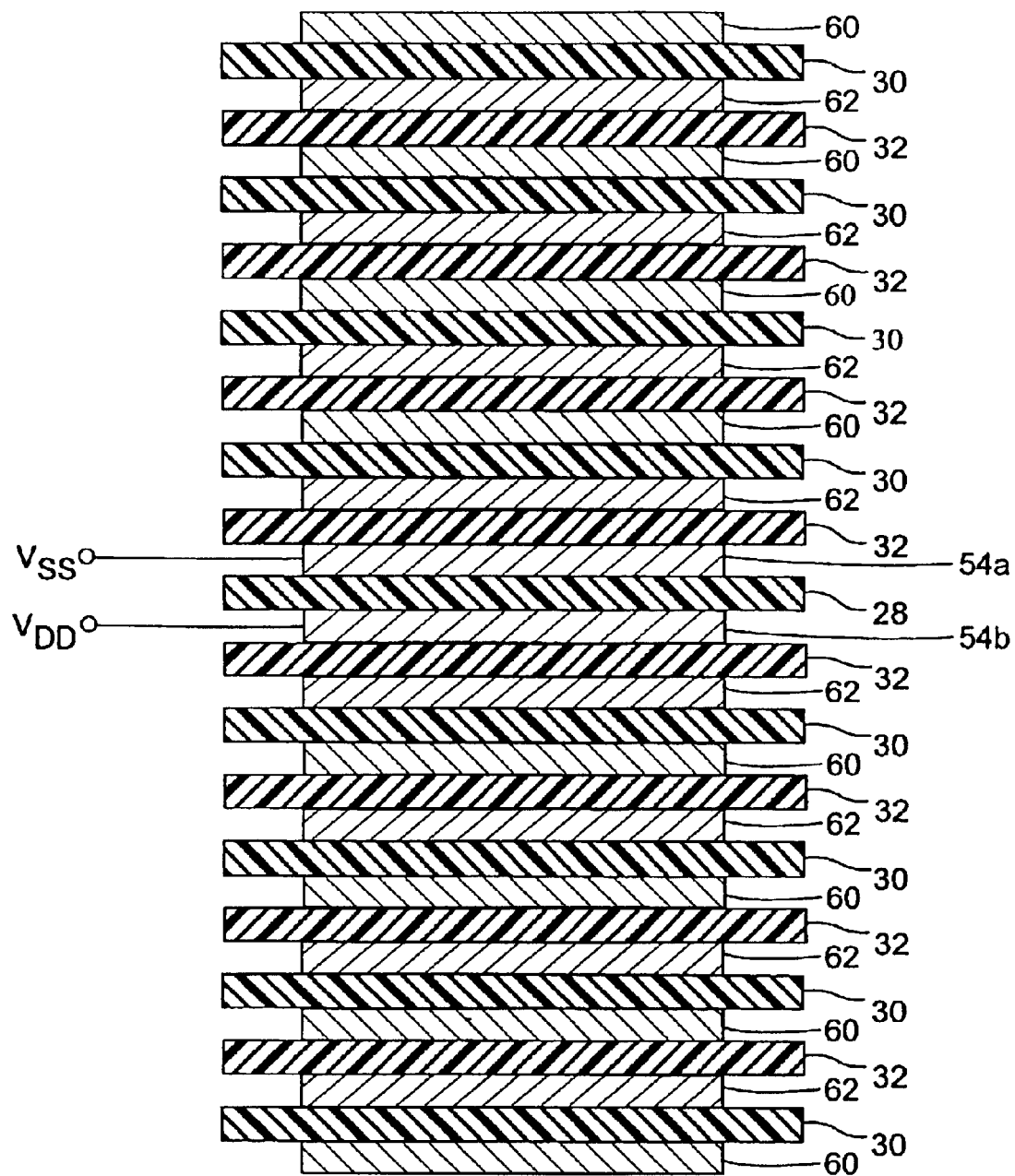
FIG. 10 is a vertical cross-sectional view of a multilayer PCB of a second embodiment of the present invention.

Referring now to FIG. 10, a second embodiment of the present invention is depicted. While the vias are not shown in this figure, the same vias 44 or 48 as were used in the first embodiment are employed for the same purposes and will be referred to in describing this embodiment.

In this embodiment the power layer 28 is double sided, i.e. there are metalized regions 54a and 54b on both of its main flat surfaces. In the figure, the upper region 54a is connected to a Vss power supply and the lower region 54b is connected to a Vdd power supply. The layers above and below the power layer 28 are ground layers 32, each having its main flat surface farthest from the power layer covered with a metalized region 62. The next layers, extending outward from the power layers in the upward and downward directions are signal layers 30, each having on its main flat surface farthest from the power layer a circuit trace pattern 60. The pattern of ground layer 32 followed by signal layer 30 repeats for the desired number of layers and ends with a signal layer 30 at each end of the stack.

The method of assembling the multilayer PCB is to assemble the lower half of the stack of alternating signal layers 30 and ground layers 32 and including the power layer 28 and adhesively fix them together. Then vias (not shown) corresponding to the vias 48 and 44 are drilled through all of the layers of the lower half of the complete stack. The vias corresponding to the vias 44 are plated or seeded so as to be electrically conductive. Different vias 44 are in electrical contact with the respective energized regions 54a and 54b on either one side or the other of the power layer 28 and may selectively connect with signal layer traces 60 on some of the signal layers 330.

Thereafter, the remaining alternating ground layers 32 and signal layers 30 for the top half of the stack are assembled and adhesively fixed together and through-vias 48 are drilled therethrough. The assembled top half of the stack is then mounted on the bottom half of the stack so that the through-vias 48 in both halves of the stack are aligned with each other and then they are seeded or plated to establish electrically conductive vertical through-vias 48 through the entire stack. The vias 44 in the bottom half of the stack are clustered to define channels in the same manner as the first embodiment. In the signal layers 30 of the top half of the stack, the traces 60 can be grouped together in signal channels 56, 58 overlying the power vias 44 in the same manner as shown in FIG. 9. Thus the same benefits as the first embodiment are achieved, namely that multiple signal traces 60 can be grouped together in signal channels 56, 58.

While certain sequences of steps have been described for the preferred embodiments of the invention, it is to be understood that in other embodiments some of these steps could be inverted to achieve the same results of providing signal channels over groupings of blind power vias. Further, in the above descriptions the terms "upper" or "lower" have been used, however, it is to be understood that these terms are merely relative to the respective figures and do not connote any absolute direction with respect to the actual products.

A general description of the apparatus and method of the present invention as well as preferred embodiments of both have been set forth above. One skilled in the art will recognize and be able to practice many changes in many aspects of the apparatus and method described above, including variations which fall within the teachings of this invention. The spirit and scope of the invention should be limited only as set forth in the claims that follow.

What is claimed is:

1. A method of manufacturing a multilayer printed circuit board comprising the steps of:

forming power routing circuitry on a first surface of a power layer;

forming a plurality of electrically conductive blind vias in the power layer that extend from the first surface of the power layer to a second surface of the power layer, the blind vias selectively electrically contacting the power routing circuitry and some of the blind vias being aligned to establish at least one cluster of blind vias;

providing signal routing circuitry and at least one signal routing channel on a first surface of at least one signal layer such that a portion of the signal routing circuitry is routed through at least one signal routing channel;

combining the signal layer and the power layer such that the at least one signal routing channel aligns with the at least one cluster of blind vias;

and forming a plurality of vertical, electrically conductive through-vias in the combined signal layer and the power layer such that the through-vias extend from the first surface of the signal layer to a second surface of the power layer the through-vias selectively electrically contacting the signal routing circuitry.

2. The method of claim 1, further comprising the steps of: mounting ground layers on the first surface of the signal layer and a second surface of the signal layer prior to combining the signal layer and the power layer.

3. The method of claim 1, wherein the steps of forming the electrically conductive through-vias and blind vias further comprises the step of: selectively seeding the through-vias and the blind vias with a electrically conductive material.

4. The method of claim 3, further comprising the step of: mounting contact elements to the selectively seeded through-vias and blind vias.

5. The method of claim 1, wherein the steps of forming the electrically conductive through-vias and blind vias further comprises the step of: selectively plating the through-vias and the blind vias with a electrically conductive material.

6. The method of claim 5, further comprising the step of: mounting contact elements to the selectively plated through-visa and blind vias.

7. A method of manufacturing a multilayer printed circuit board comprising the steps of:

providing power routing circuitry on at least first surfaces of a plurality of power layers; aligning the power layers; combining the aligned power layers into a first subassembly having a top power layer and a bottom power layer;

forming a plurality of electrically conductive blind vias in the first subassembly that extend from a first surface of the top power layer to a second surface of the bottom power layer, the plurality of blind vias selectively electrically connecting the power routing circuitry in the first subassembly, at least a portion of the plurality of blind vias being aligned to establish at least one cluster of blind vias;

providing signal routing circuitry and at least one signal routing channel on at least first surfaces of a plurality of signal layers such that at least a portion of the signal routing circuitry is routed through the at least one signal routing channel on the signal layers;

aligning the signal layers;

combining the aligned signal layers into a second subassembly having a top signal layer and a bottom signal layer;

aligning the first subassembly and the second subassembly such that the at least one signal routing channel in the signal layers aligns with the at least one cluster of blind vias in the power layers;

combining the aligned first subassembly and the second subassembly into a final assembly having a top signal layer and a bottom power layer; and forming a plurality of electrically conductive, vertical through-vias in the final assembly such that the through-vias extend from a first surface of the top signal layer to a second surface of the bottom power layer, the through-vias selectively electrically connecting with some of the signal routing circuitry in the first subassembly of signal layers.

8. The method of claim 7, further comprising the steps of: mounting ground layers on the first surface and the second surface of the signal layers prior to combining the signal layers into a second subassembly.

9. The method of claim 7, further comprising the step of: selectively seeding the through-vias and the blind vias with a electrically conductive material.

10. The method of claim 9, further comprising the step of: mounting contact elements to the selectively seeded through-vias and blind vias.

11. The method of claim 7, further comprising the step of: selectively plating the through-vias and the blind vias with a electrically conductive material.

12. The method of claim 11, further comprising the step of: mounting contact elements to the selectively plated through-visa and blind vias.

* * * * *